United States Patent
Ueda et al.

(10) Patent No.: US 8,952,331 B2
(45) Date of Patent: Feb. 10, 2015

(54) INFRARED SENSOR MODULE

(75) Inventors: Mitsuhiko Ueda, Osaka (JP); Takami Okubayashi, Mie (JP); Takanori Sugiyama, Mie (JP); Yoshiharu Sanagawa, Osaka (JP); Takanori Aketa, Osaka (JP); Yushi Nakamura, Mie (JP); Masao Kirihara, Osaka (JP)

(73) Assignee: Panasonic Corporation, Osaka (JP)

( * ) Notice: Subject to any disclaimer, the term of this patent is extended or adjusted under 35 U.S.C. 154(b) by 228 days.

(21) Appl. No.: 13/513,426

(22) PCT Filed: Dec. 17, 2010

(86) PCT No.: PCT/JP2010/072811
§ 371 (c)(1),
(2), (4) Date: Jun. 1, 2012

(87) PCT Pub. No.: WO2011/074678
PCT Pub. Date: Jun. 23, 2011

(65) Prior Publication Data
US 2012/0235044 A1  Sep. 20, 2012

(30) Foreign Application Priority Data

Dec. 18, 2009 (JP) ................. 2009-288032

(51) Int. Cl.
G01J 5/20 (2006.01)
G01J 5/16 (2006.01)
G01J 5/02 (2006.01)
G01J 5/04 (2006.01)
G01J 5/08 (2006.01)

(52) U.S. Cl.
CPC ...... *G01J 5/16* (2013.01); *G01J 5/02* (2013.01); *G01J 5/0205* (2013.01); *G01J 5/0215* (2013.01); *G01J 5/04* (2013.01); *G01J 5/046* (2013.01); *G01J 5/08* (2013.01); *G01J 5/0806* (2013.01); *G01J 5/0875* (2013.01); *H01L 2224/48137* (2013.01); *H01L 2924/3025* (2013.01)
USPC .................................................... 250/338.4

(58) Field of Classification Search
CPC ........ G08C 17/02; G01C 19/56; G06F 17/00; G06F 1/20; G06F 1/3293; G06F 3/017; G06T 9/004; G07C 9/00111; G10L 17/005; H01L 51/52; H01L 51/5203; H01L 51/5262; H01L 51/56; H01L 27/2436; H01L 29/66666; H01L 29/7827; H01L 41/113; H01L 41/1871; H01L 45/147; H01L 51/5024; H01L 51/5036; H01L 51/5268; A61B 1/00174; A61B 1/04; A61B 5/0004; B23K 1/0016; B23K 26/0093; B23K 26/032; B23K 26/08; B23K 35/0244; B29C 33/76; B29C 67/0074; B41J 2/14201; B60L 11/1809; C09J 11/06; F04B 53/18; F21V 21/005; F21V 33/0004; H01G 4/012; H01G 9/035; H02K 1/146; H02P 31/00; H03K 17/041; H04L 1/004; H04L 27/04; H04N 19/00575; H04N 19/00684; H04N 19/00775; H04N 19/00951; H05K 7/00
USPC ................... 250/338.1, 338.4, 340, 330, 332
See application file for complete search history.

(56) References Cited

U.S. PATENT DOCUMENTS

| 6,236,046 | B1 * | 5/2001 | Watabe et al. ............. 250/338.1 |
| 6,433,666 | B1 * | 8/2002 | Inoue et al. ................. 338/22 R |
| 6,777,961 | B2 * | 8/2004 | Hamamoto et al. .......... 324/703 |
| 7,005,642 | B2 * | 2/2006 | Nozu ......................... 250/338.1 |
| 2002/0170589 | A1 | 11/2002 | Hamamoto et al. |
| 2003/0183921 | A1 * | 10/2003 | Komobuchi et al. .......... 257/704 |
| 2003/0222218 | A1 | 12/2003 | Nozu |
| 2005/0081905 | A1 * | 4/2005 | Lan et al. ..................... 136/224 |
| 2005/0214979 | A1 | 9/2005 | Suzuki et al. |

| | | | | |
|---|---|---|---|---|
| 2008/0164413 | A1 | 7/2008 | Shibayama | |
| 2008/0251722 | A1* | 10/2008 | Hayashi et al. | 250/338.1 |
| 2009/0026565 | A1 | 1/2009 | Noda et al. | |

FOREIGN PATENT DOCUMENTS

| | | | |
|---|---|---|---|
| CN | 101065648 | 10/2007 | |
| CN | 101175978 | 5/2008 | |
| JP | 03-095422 | 4/1991 | |
| JP | 03095422 A * | 4/1991 | G01J 5/12 |
| JP | 03-135739 | 6/1991 | |
| JP | 06-026926 | 2/1994 | |
| JP | 8-101062 | 4/1996 | |
| JP | 2002-340668 | 11/2002 | |
| JP | 2003-149045 | 5/2003 | |
| JP | 2003-344156 | 12/2003 | |
| JP | 2004-140171 | 5/2004 | |
| JP | 2005-050974 | 2/2005 | |
| JP | 2005-147768 | 6/2005 | |
| JP | 2005-277148 | 10/2005 | |
| JP | 2006-058228 | 3/2006 | |
| JP | 2007-101513 | 4/2007 | |
| JP | 2008-180633 | 8/2008 | |
| JP | 2009-079946 | 4/2009 | |
| WO | 2007/088959 | 8/2007 | |

OTHER PUBLICATIONS

China Office action, mail date is Jan. 13, 2014.

\* cited by examiner

*Primary Examiner* — Mark R Gaworecki

(74) *Attorney, Agent, or Firm* — Greenblum & Bernstein, P.L.C.

(57) ABSTRACT

An infrared sensor module includes: an infrared sensor device disposed on a substrate and configured to receive infrared signals; a signal processing circuit device configured to process an output from the infrared sensor device; a metal case which is provided at a predetermined distance from the infrared sensor device, which includes a light incident window provided with an optical system for coupling an image on the infrared sensor device from external infrared signals, and which accommodates the infrared sensor device and the signal processing circuit device; and a sensor cover which is disposed between the infrared sensor device and the case and the signal processing circuit device, and which includes a light-transmitting portion configured to guide the infrared signals entering via the optical system to the infrared sensor device.

19 Claims, 9 Drawing Sheets

INFRARED SENSOR MODULE

TECHNICAL FIELD

The present invention relates to an infrared sensor module, and more particularly, to a mounting structure for reducing the thermal noise thereof.

BACKGROUND ART

In the related art, due to the ability to detect temperature in a non-contact manner, infrared sensors have been used widely, for example, in an automatic lighting system that detects the presence of a person and performs lighting control based on the movement of the person and for detecting the temperature inside a microwave and detecting the temperature distribution in food being cooked. The infrared sensor is a device that outputs a voltage corresponding to the amount of infrared light received in an internal sensor chip.

Although the detection field of view of the infrared sensor is determined by specifications, in practice, unnecessary infrared light from outside the field of view also enters into the device. When the infrared light enters into the sensor chip by internal reflection in the package, the infrared light becomes thermal noise. Thus, there is a problem in that detection accuracy deteriorates.

As an example of such an infrared sensor, one in which a number of resistors (mono devices) are arranged on a surface in a matrix form, a change in resistance value resulting from an increase in temperature occurring when infrared light is projected to the surface is extracted as a signal, and an image signal is created and output based on the signal is known, for example. In such an infrared sensor, it is necessary to supply a predetermined bias current in order to extract the change in resistance as a signal, and the temperature of the infrared sensor may increase due to the Joule heat resulting from the bias current. Thus, another signal is generated from the infrared sensor due to the increase in temperature caused by the Joule heat, and this signal is output as noise in the infrared sensor.

In order to prevent such noise caused by the bias current, a structure in which, as shown in FIG. 8, a ring-shaped inner 250 is fixed in a case 220 so that even when disturbance noise enters into the case 220, the disturbance noise is radiated without reaching a sensor chip 230 mounted on a circuit substrate 210, and only infrared energy collected by a lens is guided to the sensor chip 230 is proposed (Patent Document 1).

Moreover, Patent Document 2 discloses a structure in which, as shown in FIG. 9, a circuit substrate 110, an electron cooler 140, and an infrared detecting device 130 are sequentially mounted on a package 120 so that a shielding trunk 150 is provided so as to cover the infrared detecting device 130, and the shielding trunk 150 is cooled by the electron cooler 140. By cooling the infrared detecting device 130 with the electron cooler 140, an increase in the temperature of the infrared detecting device 130 caused by a bias current is prevented. By cooling the shielding trunk 150, an increase in the temperature of the infrared detecting device 130 caused by heat radiating through the shielding trunk 150 is prevented, and noise is reduced. Moreover, by forming a light incident window 150a open to the shielding trunk 150 into an appropriate opening size, incident infrared light will not leak outside the respective mono devices of the infrared detecting device 130, and the occurrence of noise is prevented.

Furthermore, an infrared sensor module in which as shown in FIG. 10, rather than shielding a thermopile device (infrared sensor device) 330, by covering the thermopile device 330 with an inner cap 350 thermally connected to a stem 310, the followability of the temperature of a cold junction of the thermopile device 330 with respect to a variation of the temperature of the stem 310 is improved (Patent Document 3). In this configuration, the thermopile device and a thermistor are covered by the inner cap so that the inner environment is thermally connected to the stem, and secondary radiation from the case 320 or the inner cap 350 does not reach the thermopile device 330.

In recent years, a mounting structure in which IC chips such as ASICs (Application Specific Integrated Circuits) for signal amplification processing are incorporated has been proposed. With this configuration, it is possible to reduce drawing of wirings, and in theory, to achieve further improvement of detection accuracy. However, when IC chips are incorporated into a housing in such a way, it is necessary to use a metal housing as a countermeasure to electrical noise. In this case, in particular, since the optical reflectivity of metal is high, internal reflection is likely to occur. Thus, a structure in which thermal noise is more likely to occur is realized. Moreover, in some cases, the extent of influence of thermal noise on IC chips for signal amplification processing becomes non-negligibly high.

RELATED ART DOCUMENTS

Patent Documents

[Patent Document 1] JP-A-2007-101513
[Patent Document 2] JP-A-08-101062
[Patent Document 3] JP-A-2003-344156

SUMMARY OF THE INVENTION

Problem to be Solved by the Invention

As above, in the infrared sensor module incorporating signal processing circuit devices, it is necessary to use a metal housing as a countermeasure to electrical noise. In this case, in particular, since the optical reflectivity of metal is high, there is a problem in that internal reflection is likely to occur. In addition, since there is a problem of thermal noise due to heating of the signal processing circuit device, a structure in which thermal noise is more likely to occur is realized.

The present invention has been made in view of the above problem, and an object of the present invention is to provide an infrared sensor module capable of reducing thermal noise and detecting infrared radiation with high accuracy and high reliability.

Means for Solving the Problem

According to the present invention, there is provided an infrared sensor module including: an infrared sensor device disposed on a substrate and configured to receive infrared signals; a signal processing circuit device configured to process an output from the infrared sensor device; a metal case which is provided at a predetermined distance from the infrared sensor device, which comprises a light incident window provided with an optical system for coupling an image on the infrared sensor device from external infrared signals, and which accommodates the infrared sensor device and the signal processing circuit device; and a sensor cover which is disposed between: the infrared sensor device; and the case and the signal processing circuit device, and which comprises a light-transmitting portion configured to guide the infrared signals entering via the optical system to the infrared sensor device.

According to the present invention, in the infrared sensor module, the sensor cover includes: a side wall portion which contacts the substrate so as to surround the periphery of the infrared sensor device; and an upper surface which extends from the side wall portion and is formed between the infrared sensor device and the optical system, and in which the light-transmitting portion defines an opening thereof.

According to the present invention, in the infrared sensor module, the sensor cover is formed of a metal material.

According to the present invention, in the infrared sensor module, the sensor cover is bonded to the substrate by a heat-conductive material.

According to the present invention, in the infrared sensor module, the sensor cover is bonded to the substrate by a conductive material.

According to the present invention, in the infrared sensor module, a strip-shaped metal ring is disposed in a region surrounding the infrared sensor device-mounting region and the signal processing circuit device-mounting region of the substrate, and the metal ring contacts a flange portion formed in the substrate-side end portion of the case to form a sealing portion.

In the present invention, the infrared sensor module includes an interior case formed of a resin compact on an inner side of the case.

According to the present invention, in the infrared sensor module, a black plating layer may be formed on an inner wall of the case.

According to the present invention, in the infrared sensor module, the infrared sensor device is connected to the substrate via a wire, and the sensor cover is formed so as to cover the periphery of the infrared sensor device except a region where the wire is drawn out.

According to the present invention, in the infrared sensor module, the wires of the infrared sensor device may be drawn out from two opposing sides of the infrared sensor device, and the sensor cover may be bonded to the substrate on two opposing sides where the wires are not disposed.

According to the present invention, in the infrared sensor module, the infrared sensor device is connected to the substrate via bumps.

According to the present invention, in the infrared sensor module, the infrared sensor device is mounted on the substrate by surface-mounting.

According to the present invention, in the infrared sensor module, the sensor cover contacts the substrate at an entire periphery of the infrared sensor device.

According to the present invention, in the infrared sensor module, a connection between the infrared sensor device and the signal processing circuit device is established via an inner wiring formed in the substrate.

According to the present invention, in the infrared sensor module, a heat blocking portion may be formed on the substrate between the infrared sensor device and the sensor cover.

According to the present invention, in the infrared sensor module, the heat blocking portion includes a ring-shaped groove.

According to the present invention, in the infrared sensor module, the substrate includes a thin region in the signal processing circuit device-mounting region.

According to the present invention, in the infrared sensor module, the substrate includes a ceramic substrate, and a wiring conductor layer is formed in a region contacting the sensor cover.

Advantages of the Invention

According to the infrared sensor module according to the present invention, the sensor cover prevents infrared noise from outside the field of view, entering after being reflected by the case. Moreover, it is possible to reduce the influence of infrared noise due to the occurrence of radiation heat resulting from heating of the case and to improve detection accuracy.

BRIEF DESCRIPTION OF THE DRAWINGS

FIG. 1 is a view showing an infrared sensor module according to a first embodiment of the present invention, in which FIG. 1(a) is a cross-sectional view, FIG. 1(b) is a top view showing a state where a case and a sensor cover are removed, and FIG. 1(c) is a side cross-sectional view.

FIG. 3 is a view showing an infrared sensor module according to a second embodiment of the present invention, in which FIG. 3(a) is a cross-sectional view and FIG. 3(b) is an enlarged cross-sectional view of a main part.

FIG. 5 is a view showing an infrared sensor module according to a fourth embodiment of the present invention, in which FIG. 5(a) is a cross-sectional view, FIG. 5(b) is a top view showing a state where a case and a sensor cover are removed, and FIG. 5(c) is a side cross-sectional view.

FIG. 7 is a view showing a modification example of the infrared sensor module according to the fourth embodiment of the present invention, in which FIG. 7(A) is a cross-sectional view, FIG. 7(b) is a top view showing a state where a case and a sensor cover are removed, and FIG. 7(c) is a side cross-sectional view.

MODE FOR CARRYING OUT THE INVENTION

Hereinafter, infrared sensor modules according to embodiments of the present invention will be described in detail with reference to drawings.

First Embodiment

Figure 1:
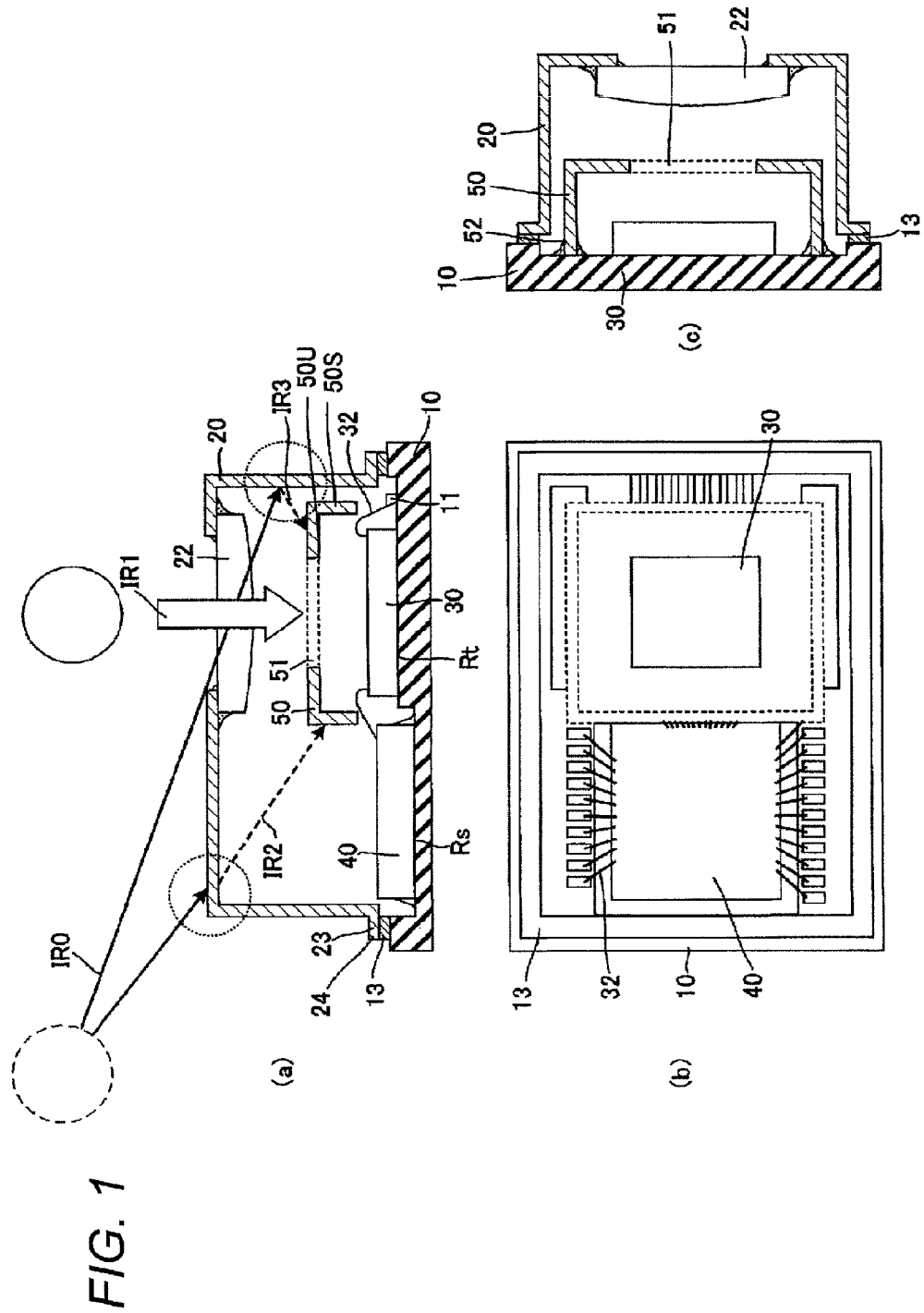
Figure 2:
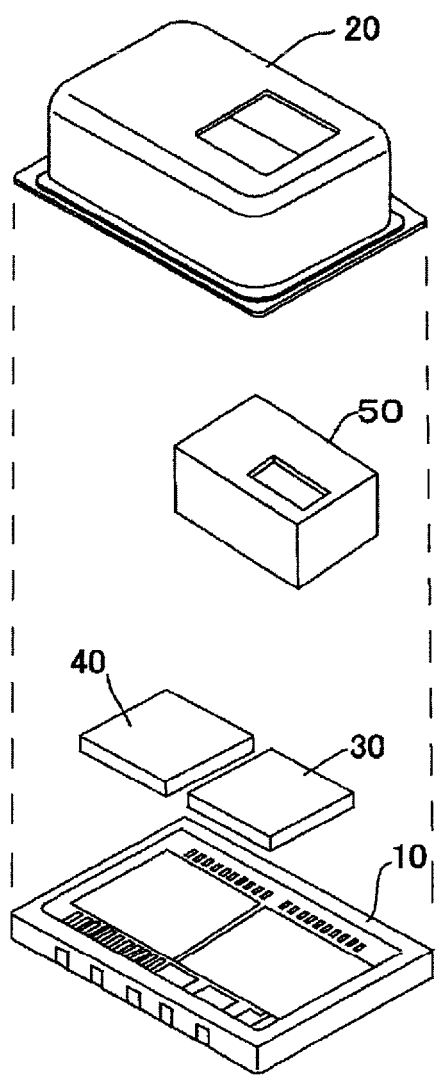
FIG. 2 is an exploded perspective view showing the infrared sensor module.

FIG. 1 is a view showing an infrared sensor module according to a first embodiment of the present invention, in which FIG. 1(a) is a cross-sectional view, FIG. 1(b) is a top view showing a state where a case and a sensor cover are removed, and FIG. 1(c) is a side cross-sectional view. FIG. 2 is an exploded perspective view showing the infrared sensor module.

The infrared sensor module according to the first embodiment of the present invention includes: an infrared sensor device 30 that is disposed on a substrate 10 so as to receive infrared signals; a signal processing circuit device 40 that processes the output from the infrared sensor device 30; a metal case 20 which is provided at a predetermined distance from the infrared sensor device 30, and which has a light incident window provided with a lens 22 serving as an optical system for forming an image on the infrared sensor device 30 with external infrared signals and accommodates the infrared sensor device 30 and the signal processing circuit device 40; and a sensor cover 50 formed of Kovar, which is disposed between the infrared sensor device 30, and the case 20 and the signal processing circuit device 40, and which has a light-transmitting portion 51 that guides the infrared signals entering via the optical system to the infrared sensor device 30. The substrate 10 includes a wiring pattern (not shown) on its surface.

The infrared sensor device used in this example is a thermopile-type sensor which is mounted in the substrate 10 by surface-mounting. The infrared sensor device is fixed to the substrate 10 and is electrically connected to the substrate 10 by wire-bonding. Reference numeral 32 is a bonding wire. Although not shown in the drawing, the thermopile-type sensor is configured to detect infrared light as a voltage using the thermoelectric effect (Seebeck effect) in which in thermocouples formed by polysilicon micromachining, a temperature difference is caused to occur between these junctions using infrared radiation heat to create a potential difference between the junctions with the temperature difference. This thermopile-type infrared sensor converts received infrared light to heat using an infrared absorbing film, applies this heat to a number of thermocouples connected in series, and outputs a change in the temperature of hot junctions as a voltage using the thermocouples. In this thermopile, a gold black film, a carbon film, or the like having high infrared absorptivity is used as a material of the infrared absorbing film that absorbs infrared light.

The sensor cover 50 is bonded to the substrate 10 by a heat-conductive material such as a silver paste 52. The silver paste facilitates the exchange of heat between the sensor cover 50 and the substrate 10. Thus, it is possible to prevent heat from being partially confined around the sensor.

Moreover, a strip-shaped metal ring 13 is disposed in a region surrounding an infrared sensor device-mounting region Rt and a signal processing circuit device-mounting region Rs of the substrate 10. The metal ring 13 is in contact with a flange portion 23 formed in a substrate-side end portion of the case 20 and forms a sealing portion 24.

Here, reference numeral 11 is a wiring conductor layer formed on the substrate surface, which is electrically connected to the infrared sensor device 30 via the bonding wires 32. Moreover, the electrical connection between the infrared sensor device 30 and the signal processing circuit device 40 is realized by the bonding wire 32.

Moreover, the sensor cover 50 includes side wall portions 50S that are in contact with the substrate 10 so as to surround the periphery of the infrared sensor device 30 and an upper surface 50U which extends from the side wall portions 50S, and which is formed between the infrared sensor device 30 and the lens 22 serving as the optical system, and in which the light-transmitting portion 51 forms the opening thereof.

With this configuration, the infrared sensor device 30 is covered by the sensor cover 50, and the sensor cover 50 is provided between the signal processing circuit device 40 and the infrared sensor device 30. Thus, it is possible to prevent thermal noise due to radiation from the signal processing circuit device to the infrared sensor device and from the infrared sensor device to the signal processing circuit device. Moreover, infrared signals based on a radiant ray IR2 which is an infrared signal IR0 from a non-target object, entering through the metal case and a radiant ray IR3 caused by reflection from the metal case are removed. Therefore, since it is possible to detect an infrared signal IR1 of only a target object, measurement accuracy is improved.

Moreover, since the sensor cover 50 includes the side wall portions 50S, by disposing the sensor cover 50 so as to surround the periphery of the infrared sensor device 30 as much as possible, it is possible to reliably remove noise entering from the upper surface and the side surfaces.

Moreover, the bonding wires 32 of the infrared sensor device 30 are drawn out from two opposing sides of the infrared sensor device, and the sensor cover 50 is bonded to the substrate 10 at two opposing sides on which the bonding wires 32 are not disposed. Thus, it is possible to divide between the sensor cover-fixing sides and the wire bonding sides and to decrease the size of the infrared sensor module.

In the above embodiment, although the sensor cover 50 is formed of Kovar, other metals such as copper or stainless steel may be used. Moreover, by connecting the sensor cover 50 to the substrate by a conductive material, the sensor cover 50 can be electrically connected to a shielding surface and have electromagnetic shielding properties.

Moreover, the strip-shaped metal ring 13 formed in the region surrounding the infrared sensor device-mounting region Rt and the signal processing circuit device-mounting region Rs of the substrate 10 is in contact with the flange portion 23 formed in the substrate-side end portion of the case to form the sealing portion. Thus, it is possible to improve air-tight sealing properties and electrical shielding properties. Moreover, the strip-shaped metal ring also has the role of a heat blocking portion. Furthermore, a ring-shaped groove may be formed as the heat blocking portion.

Furthermore, when a ceramic substrate having good heat radiating properties such as aluminum nitride is used as the substrate 10 and the wiring conductor layer is formed in a region contacting the sensor cover, it is possible to further improve the heat radiating properties.

Moreover, since a thin region is formed in the region Rs on which the signal processing circuit device 40 is mounted, it is possible to obtain good heat radiating properties and to suppress thermal noise entering to the infrared sensor device 30.

Second Embodiment

Figure 3:
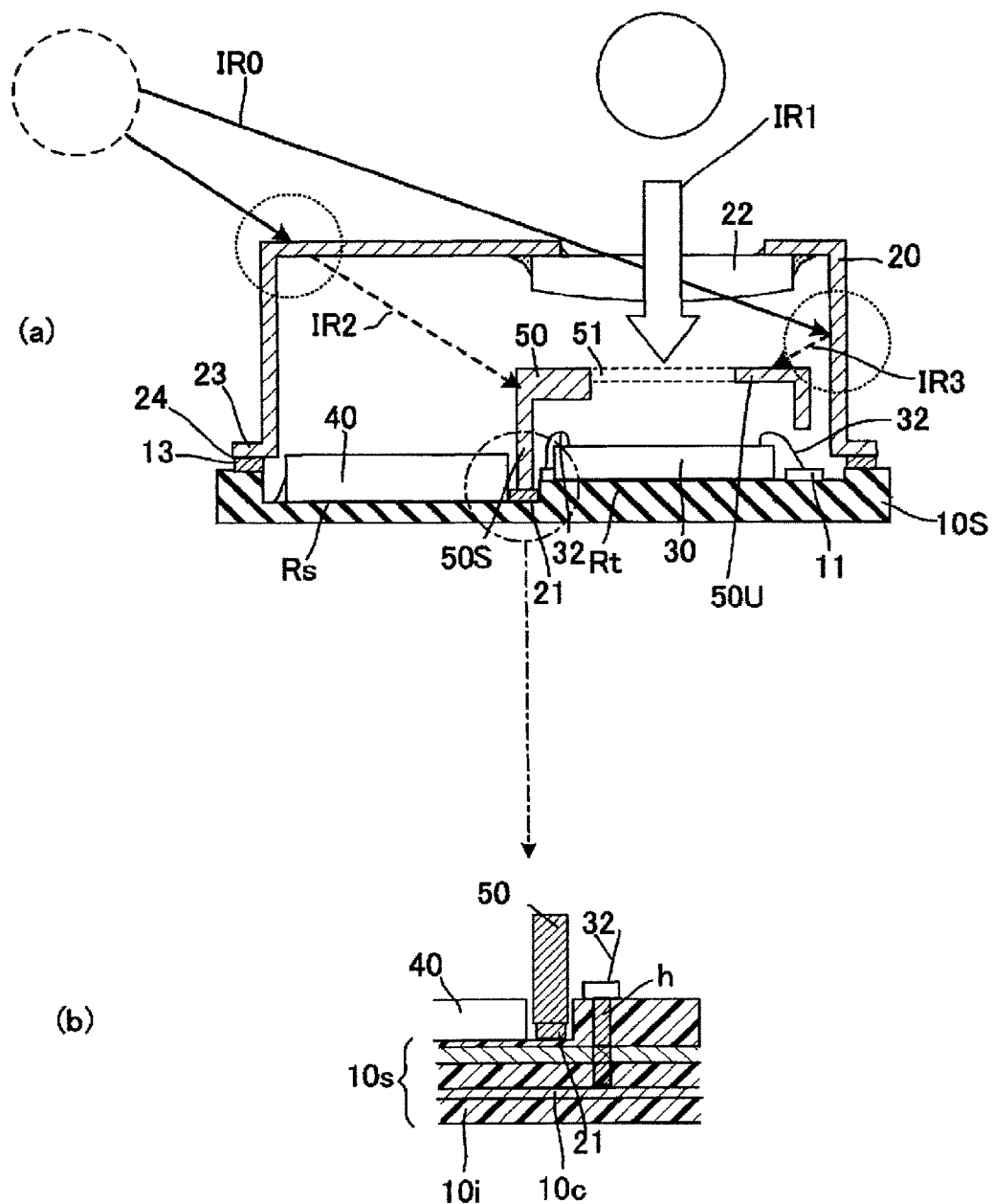

In the above embodiment, although the infrared sensor device 30 and the signal processing circuit device 40 are electrically connected by the bonding wire 32, as shown in FIGS. 3(*a*) and 3(*b*), by using a multilayer wiring substrate 10S as the substrate, the devices can be electrically connected within a layer by a through-hole h and an inner layer 10*c*. The multilayer wiring substrate 10S is configured as a laminate of an insulating layer 10*i* formed of a ceramic material and a conductor layer serving as the inner layer 10*c*. Desired wirings can be formed easily on the multilayer wiring substrate 10S by baking a green sheet laminate. The connection between the signal processing circuit device 40 and the infrared sensor device 30 can be realized via the bonding wires 32, the through-hole h, and the inner layer 10*c*. FIG. 3(*a*) is a cross-sectional view, and FIG. 3(*b*) is an enlarged cross-sectional view of a main part of FIG. 3(*a*).

In this way, it is possible to dispose the side wall portions 50S of the sensor cover 50 so as to make contact with the multilayer wiring substrate 10S. Thus, the sensor cover reliably covers the periphery of the infrared sensor device, whereby noise entering from the side surfaces can be removed reliably.

Furthermore, when a ceramic substrate having good heat radiating properties such as aluminum nitride is used as the substrate and the wiring conductor layer 21 is formed in a region contacting the sensor cover 50, it is possible to further improve the heat radiating properties.

Third Embodiment

Next, a third embodiment of the present invention will be described.

Figure 4:
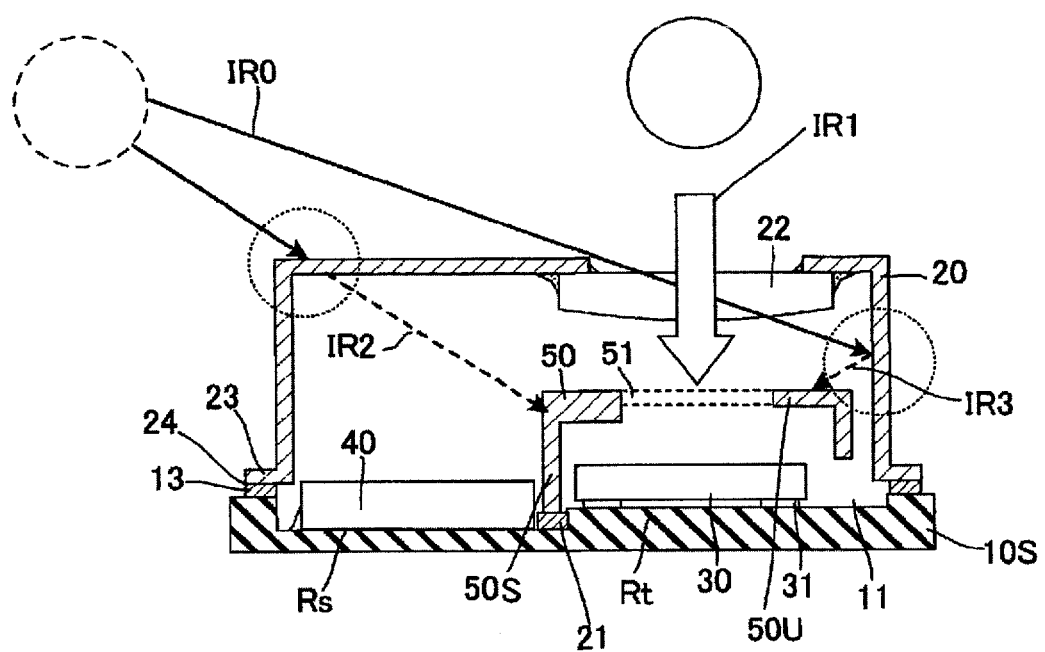
FIG. 4 is a view showing an infrared sensor module according to a third embodiment of the present invention.

In the first embodiment, although the infrared sensor device 30 is connected to the substrate 10 via the bonding wires 32 by wire-bonding, in the present embodiment, as shown in FIG. 4, the infrared sensor device 30 is directly connected to the substrate via bumps 31. The infrared sensor device 30 and the signal processing circuit device 40 are connected within the substrate 10S via the through-hole h similarly to the second embodiment. Thus, the sensor cover 50 is disposed very closely to the infrared sensor device 30 so as to reliably surround the periphery of the infrared sensor device 30. Moreover, the connection between the infrared sensor device 30 and the signal processing circuit device 40 is realized by a wiring conductor layer 11 formed on the substrate 10. The other portions are formed similarly to the first and second embodiments, and description thereof will not be provided.

Thus, in this case, since thermal shielding and electrical shielding are more efficiently realized in the infrared sensor device 30, it is possible to suppress the occurrence of thermal noise caused by the occurrence of radiation heat. Moreover, by adjacently disposing the sensor cover, it is possible to further decrease the size of the infrared sensor module.

Similarly to the second embodiment, in this case, when the multilayer wiring substrate 10S is used as the substrate, the infrared sensor device 30 and the signal processing circuit device 40 can be electrically connected within an inner layer (not shown) via a through-hole. Thus, the sensor cover can be closely attached to the substrate in a more reliable manner.

Fourth Embodiment

Next, a fourth embodiment of the present invention will be described.

Figure 5:
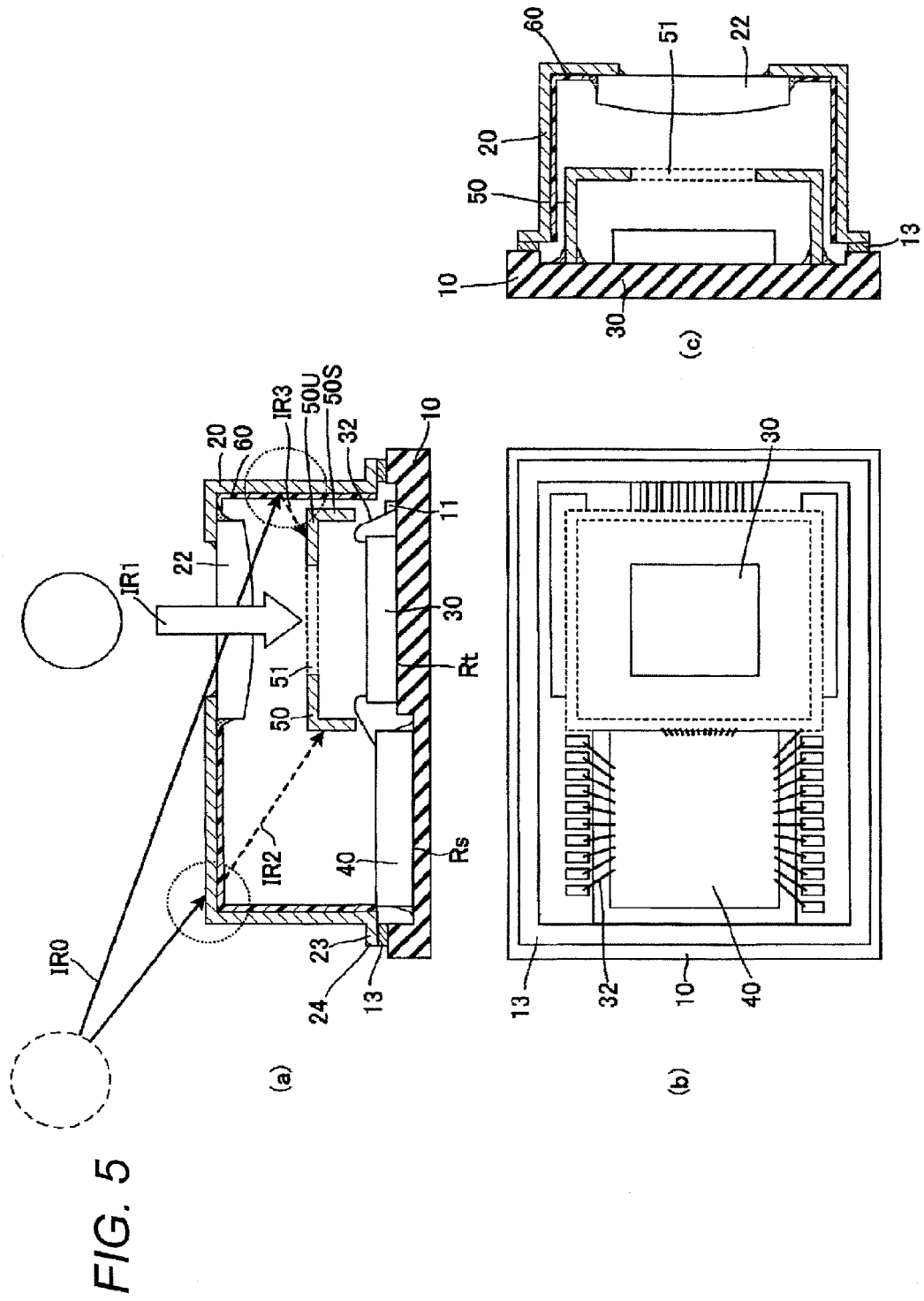
Figure 6:
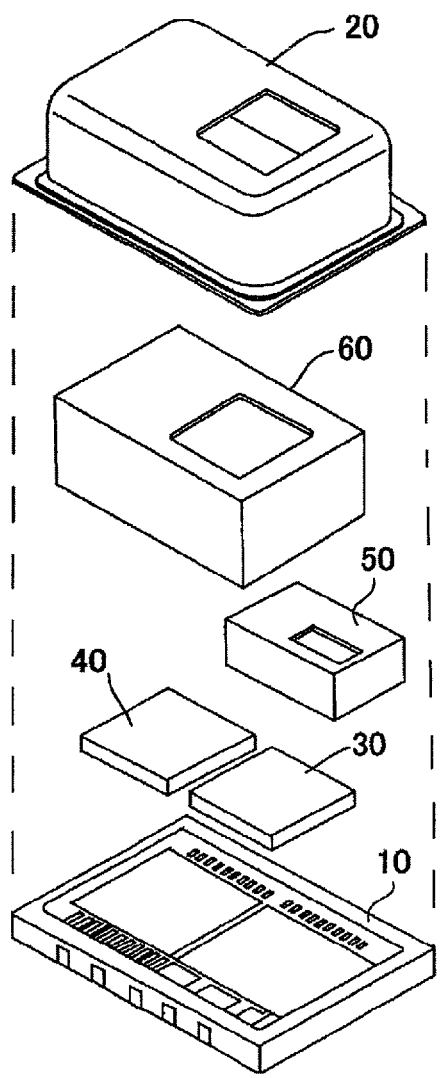
FIG. 6 is an exploded perspective view showing the infrared sensor module.

FIG. 5 is a view showing an infrared sensor module according to a fourth embodiment of the present invention, in which FIG. 5(a) is a cross-sectional view, FIG. 5(b) is a top view showing a state where a case and a sensor cover are removed, and FIG. 5(c) is a side cross-sectional view. FIG. 6 is an exploded perspective view showing the infrared sensor module.

In the infrared sensor module of the fourth embodiment of the present invention, an interior case 60 formed of an insulating resin is additionally formed inside the case 20 in addition to the configuration of the infrared sensor module according to the first embodiment. The other portions are formed similarly to the infrared sensor module shown in the first embodiment. In this embodiment, the same portions will be denoted by the same reference numerals, and description thereof will not be provided.

With this configuration, it is possible to further suppress thermal noise in addition to the advantageous effects of the first embodiment.

Figure 7:
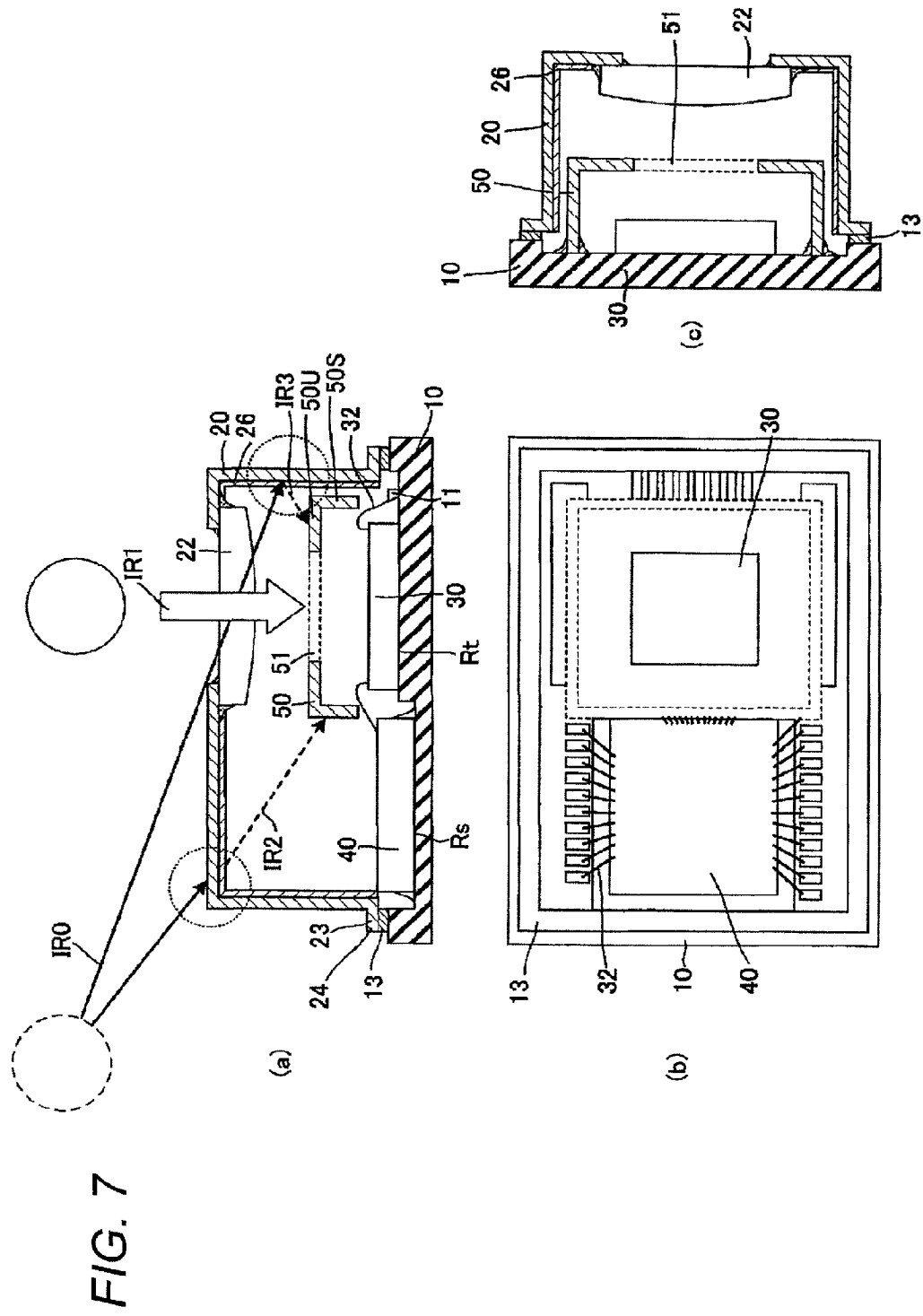
Figure 8:
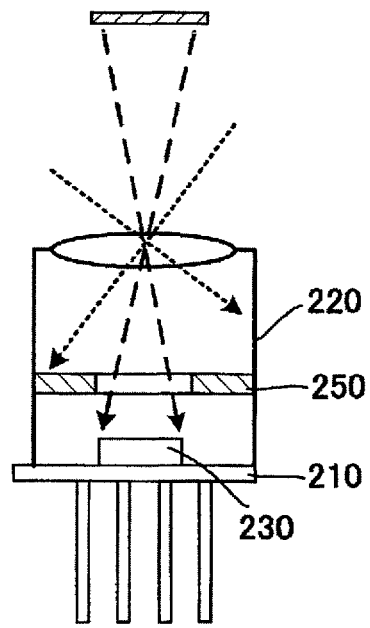
FIG. 8 is a view showing an infrared sensor module according to the related art.
Figure 9:
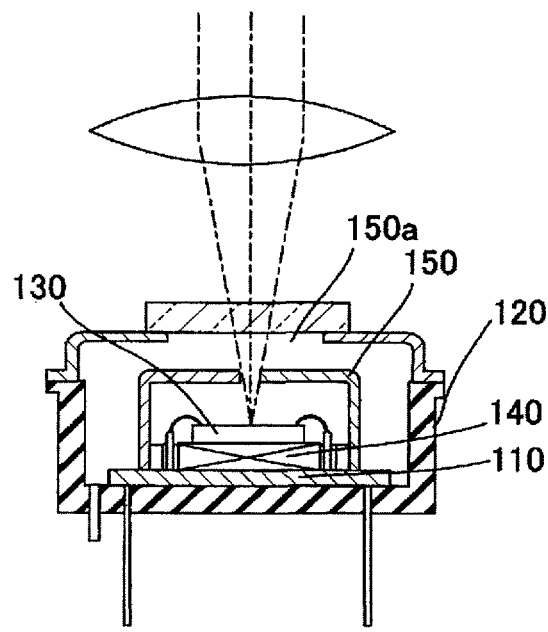
FIG. 9 is a view showing another infrared sensor module according to the related art.
Figure 10:
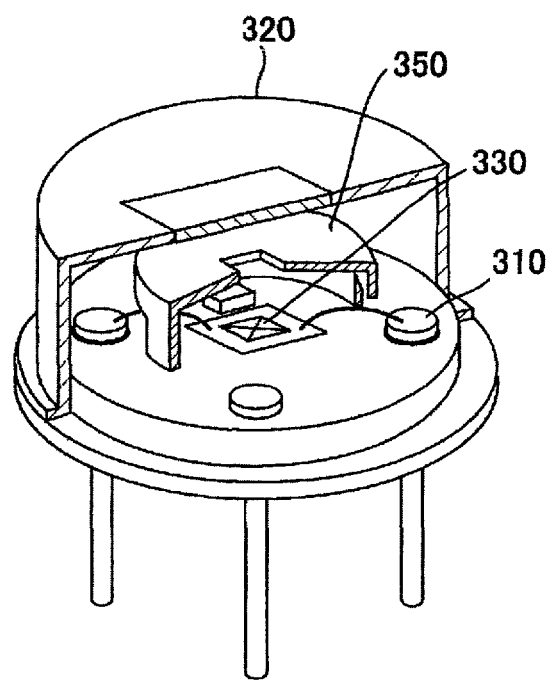
FIG. 10 is a view showing still another infrared sensor module according to the related art.

Without being limited to the interior case, the same advantageous effects can be obtained by disposing an anti-reflection member on the inner side. For example, as the anti-reflection member, as shown in FIGS. 7(a) to 7(c), a black metal plating layer 26 formed on the inner side of the metal case 20 may be used. In this embodiment, the same portions as the first embodiment are denoted by the same reference numerals.

As described above, according to the present invention, since the infrared sensor device is covered by the sensor cover, and the sensor cover is also provided between the signal processing circuit device and the infrared sensor device, it is possible to prevent thermal noise caused by radiation from the infrared sensor device to the signal processing circuit device. Thus, the infrared signals serving as noise are removed. Therefore, since it is possible to detect the infrared signal of only a target object, measurement accuracy is improved.

Hereinafter, the operational effects of the respective configurations will be described.

First, in the infrared sensor module, the infrared sensor device may be mounted on the substrate by surface-mounting.

In particular, in the case of surface-mounting in the infrared sensor module, since the infrared sensor device is disposed to make surface-contact with the substrate, a change in temperature of the infrared sensor device itself has a great influence on the signal processing circuit device. In such a case, according to the present invention, since the sensor cover is included, it is possible to prevent thermal noise caused by radiation from the infrared sensor device to the signal processing circuit device.

Moreover, in the infrared sensor module, the sensor cover may include: a side wall portion which contacts the substrate so as to surround the periphery of the infrared sensor device; and an upper surface which extends from the side wall portion and is formed between the infrared sensor device and the optical system, and in which the light-transmitting portion defines an opening thereof.

With this configuration, since the sensor cover includes the side wall portion which contacts the substrate so as to surround the periphery of the infrared sensor device, by disposing the sensor cover so as to surround the periphery of the infrared sensor device as much as possible, it is possible to reliably remove noise entering from the upper surface and the side surfaces.

Moreover, in the infrared sensor module, the sensor cover may be formed of a metal material.

With this configuration, noise entering toward the sensor is reflected by the sensor cover formed of a metal material, and noise can be prevented from entering the sensor.

Moreover, in the infrared sensor module, the sensor cover may be bonded to the substrate by a heat-conductive material.

With this configuration, exchange of heat between the sensor cover and the substrate is facilitated. Thus, it is possible to prevent heat from being partially confined around the sensor.

Moreover, in the infrared sensor module, the sensor cover may be bonded to the substrate by a conductive material.

With this configuration, it is possible to electrically connect the sensor cover to the shielding surface and to provide the sensor cover with electromagnetic shielding properties.

Moreover, in the infrared sensor module, a strip-shaped metal ring may be disposed in a region surrounding the infrared sensor device-mounting region and the signal processing circuit device-mounting region of the substrate, and the metal ring may contact a flange portion formed in the substrate-side end portion of the case to form a sealing portion.

With this configuration, it is possible to improve the sealing properties of a substrate peripheral portion and to improve electrical shielding properties.

Moreover, in the present invention, the infrared sensor module may include an interior case formed of a resin compact on an inner side of the case.

With this configuration, thermal noise entering into the case is absorbed by the interior case formed of a resin, and noise is prevented from entering the sensor.

Moreover, in the infrared sensor module, a black plating layer may be formed on an inner wall of the case.

With this configuration, thermal noise entering into the case is absorbed by the black plating layer, and noise is prevented from entering the sensor.

Moreover, in the infrared sensor module, the infrared sensor device may be connected to the substrate via a wire, and the sensor cover may be formed so as to cover the periphery of the infrared sensor device except a region where the wire is drawn out.

With this configuration, it is possible to suppress thermal noise from entering the infrared sensor device more efficiently.

Moreover, in the infrared sensor module, the wires of the infrared sensor device may be drawn out from two opposing sides of the infrared sensor device, and the sensor cover may be bonded to the substrate on two opposing sides where the wires are not disposed.

With this configuration, it is possible to divide between the sensor cover-fixing sides and the wire bonding sides and to decrease the size of the infrared sensor module.

Moreover, in the infrared sensor module, the infrared sensor device may be connected to the substrate via bumps.

With this configuration, since it is possible to mount the infrared sensor device without drawing out wires, it is possible to completely surround the periphery of the infrared sensor device with the sensor cover.

Moreover, in the infrared sensor module, the sensor cover may contact the substrate at an entire periphery of the infrared sensor device.

Moreover, in the infrared sensor module, a connection between the infrared sensor device and the signal processing circuit device may be established via an inner wiring formed in the substrate.

Moreover, in the infrared sensor module, a heat blocking portion may be formed on the substrate between the infrared sensor device and the sensor cover.

Moreover, in the infrared sensor module, the heat blocking portion may include a ring-shaped groove.

Moreover, in the infrared sensor module, the substrate may include a thin region in the signal processing circuit device-mounting region.

Moreover, in the infrared sensor module, the substrate may include a ceramic substrate, and a wiring conductor layer may be formed in a region contacting the sensor cover.

With this configuration, it is possible to allow heat to be discharged via the wiring conductor layer.

This application is based on Japanese Patent Application No. 2009-288032, filed on Dec. 18, 2009, the entire contents of which are incorporated by reference herein.

DESCRIPTION OF REFERENCE SIGNS

10: Substrate
10i: Insulating Layer
10c: Inner Layer
10S: Multilayer Wiring Substrate
11: Wiring Conductor Layer
13: Metal Ring
20: Case
21: Wiring Conductor Layer
22: Lens
23: Flange Portion
24: Sealing Portion
26: Black Plating Layer
30: Infrared Sensor Device
31: Bump
32: Bonding Wire
40: Signal Processing Circuit Device
50: Sensor Cover
50U: Upper Surface
50S: Side Wall Portion
51S: Light-Transmitting Portion
60: Interior Case
IR0: Infrared Signal from Non-Target Object
IR1: Infrared Signal from Target Object
IR2: Radiant Ray from Non-Target Object
IR3: Radiant Ray from Non-Target Object

The invention claimed is:

1. An infrared sensor module comprising:
an infrared sensor device disposed on a sensor region of a substrate;
a signal processing circuit configured to process an output from the infrared sensor device, the signal processing circuit being disposed on a thin region of the substrate; and
a case provided at a predetermined distance from the infrared sensor device, the case comprising a window, and accommodating the infrared sensor device and the signal processing circuit,
wherein a thickness of the thin region of the substrate is smaller than a thickness of the sensor region of the substrate.

2. The infrared sensor module according to claim 1, further comprising a sensor cover,
wherein the sensor cover comprises:
a side wall portion that contacts the substrate to surround a periphery of the infrared sensor device; and
an upper surface that extends from the side wall portion.

3. The infrared sensor module according to claim 2,
wherein the sensor cover comprises a metal material.

4. The infrared sensor module according to claim 2,
wherein the sensor cover is bonded to the substrate by a heat-conductive material.

5. The infrared sensor module according to claim 2,
wherein the sensor cover is bonded to the substrate by a conductive material.

6. The infrared sensor module according to claim 2,
wherein the infrared sensor device is connected to at least one of the substrate and the signal processing circuit via at least one wire, and
wherein the sensor cover is provided to cover the periphery of the infrared sensor device except a region where the at least one wire is drawn out.

7. The infrared sensor module according to claim 6,
wherein the at least one wire connected to the infrared sensor device is drawn out from two opposing sides of the infrared sensor device, and
wherein the sensor cover is bonded to the substrate on two opposing sides where the at least one wire is not disposed.

8. The infrared sensor module according to claim 2,
wherein a heat blocking portion is provided on the substrate between the infrared sensor device and the sensor cover.

9. The infrared sensor module according to claim 8,
wherein the heat blocking portion comprises a ring-shaped groove.

10. The infrared sensor module according to claim 2,
wherein the substrate is a ceramic substrate, and
wherein a wiring conductor layer is provided in a region of the substrate contacting the sensor cover.

11. The infrared sensor module according to claim 1,
wherein a strip-shaped metal ring is disposed in a region of the substrate which surrounds the infrared sensor device and the signal processing circuit, and
wherein the metal ring contacts a flange portion provided in an open end portion of the case to provide a sealing portion.

12. The infrared sensor module according to claim 1, further comprising:
an interior case comprising a resin compact on an inner side of the case.

13. The infrared sensor module according to claim 1, wherein a black plating layer is provided on an inner wall of the case.

14. The infrared sensor module according to claim 1, wherein the infrared sensor device is connected to the substrate via a bump.

15. The infrared sensor module according to claim 1, wherein the infrared sensor device is mounted on the substrate by surface-mounting.

16. The infrared sensor module according to claim 15, further comprising a sensor cover,
wherein the sensor cover contacts the substrate at an entire periphery of the infrared sensor device.

17. The infrared sensor module according to claim 1, wherein a connection between the infrared sensor device and the signal processing circuit is established via an inner wiring provided in the substrate.

18. The infrared sensor module according to claim 1, wherein the window of the case is a light incident window, provided with an optical system for coupling an image on the infrared sensor device from external infrared signals.

19. The infrared sensor module according to claim 18, further comprising a sensor cover disposed between the infrared sensor device and the case, and between the infrared sensor device and the signal processing circuit, the sensor cover comprising a light-transmitting portion that guides the infrared signals entering via the optical system to the infrared sensor device.

* * * * *